United States Patent
You et al.

(10) Patent No.: US 9,668,384 B2
(45) Date of Patent: May 30, 2017

(54) POWER CONVERSION DEVICE AND METHOD FOR ASSEMBLING THE SAME

(71) Applicant: DELTA ELECTRONICS (SHANGHAI) CO., LTD., Shanghai (CN)

(72) Inventors: Pei-Ai You, Shanghai (CN); Xing-Xian Lu, Shanghai (CN); Gang Liu, Shanghai (CN); Jin-Fa Zhang, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 242 days.

(21) Appl. No.: 14/546,670

(22) Filed: Nov. 18, 2014

(65) Prior Publication Data

US 2015/0146377 A1 May 28, 2015

(30) Foreign Application Priority Data

Nov. 26, 2013 (CN) .......................... 2013 1 0612824

(51) Int. Cl.
*H05K 7/20* (2006.01)
*H05K 7/14* (2006.01)
*H01F 27/08* (2006.01)
*H05K 1/02* (2006.01)
*H05K 3/32* (2006.01)

(52) U.S. Cl.
CPC ....... *H05K 7/20854* (2013.01); *H01F 27/085* (2013.01); *H05K 1/0203* (2013.01); *H05K 3/32* (2013.01); *H05K 7/1432* (2013.01); *H05K 7/20927* (2013.01); *Y10T 29/4913* (2015.01)

(58) Field of Classification Search
None
See application file for complete search history.

(56) References Cited

U.S. PATENT DOCUMENTS

| 5,373,418 A * | 12/1994 | Hayasi | H01L 23/4006 257/718 |
| 9,058,932 B2 * | 6/2015 | Ebersberger | H01G 2/08 |
| 2010/0091464 A1 * | 4/2010 | Ohnishi | H01L 23/053 361/723 |
| 2011/0100598 A1 * | 5/2011 | Gommel | H01L 23/367 165/80.2 |
| 2013/0223011 A1 | 8/2013 | You et al. | |

FOREIGN PATENT DOCUMENTS

| CN | 202093932 | 12/2011 |
| CN | 202307422 | 7/2012 |
| CN | 102832029 | 12/2012 |
| CN | 102918610 | 2/2013 |
| CN | 203105029 | 7/2013 |
| CN | 203105029 U * | 7/2013 |
| DE | 202010000573 | 6/2010 |
| EP | 0449640 | 10/1991 |

(Continued)

*Primary Examiner* — Courtney Smith
*Assistant Examiner* — Zhengfu Feng
(74) *Attorney, Agent, or Firm* — CKC & Partners Co., Ltd.

(57) ABSTRACT

A method for assembling a power conversion device is provided. The method includes mounting an electronic component on a heat-dissipating base, and electrically connecting a printed wiring board with the electronic component mounted on the heat-dissipating base.

3 Claims, 17 Drawing Sheets

(56) References Cited

FOREIGN PATENT DOCUMENTS

| | | |
|---|---|---|
| EP | 0751540 | 1/1997 |
| JP | S60-151186 | 10/1985 |
| JP | H 03-278596 | 12/1991 |
| JP | H U4-105505 | 9/1992 |
| JP | 2001-326306 | 11/2001 |
| JP | 2005-73392 | 3/2005 |
| JP | 2010-157599 | 7/2010 |
| JP | 2013-51320 | 3/2013 |
| JP | 2013-125857 | 6/2013 |
| TW | I305035 | 1/2009 |
| TW | I339789 | 4/2011 |
| TW | 201129304 | 8/2011 |
| TW | 201336211 | 9/2013 |

\* cited by examiner

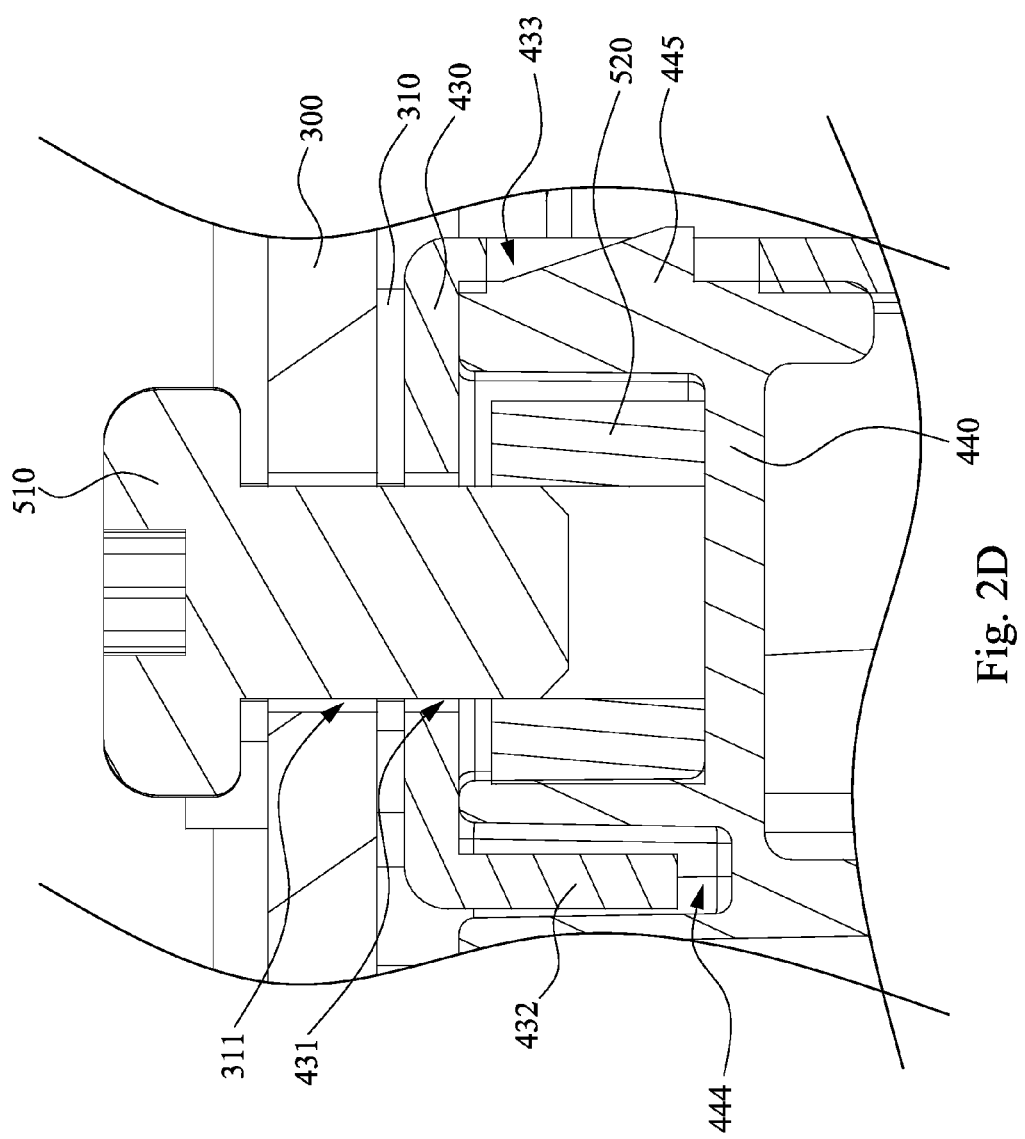

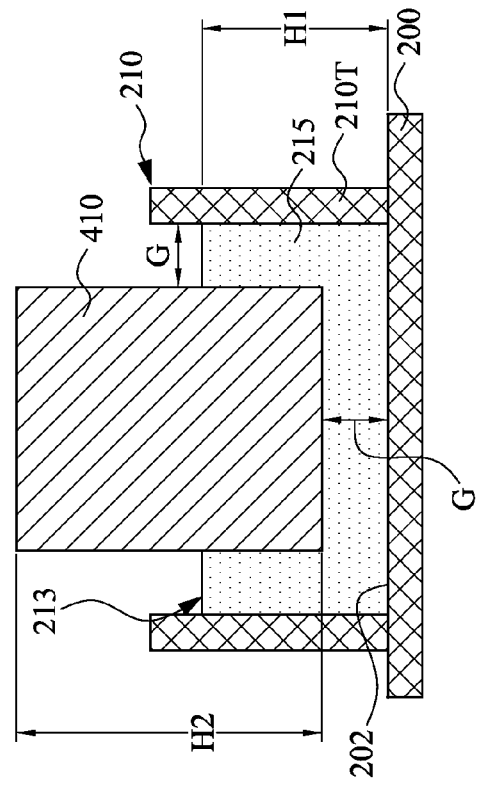
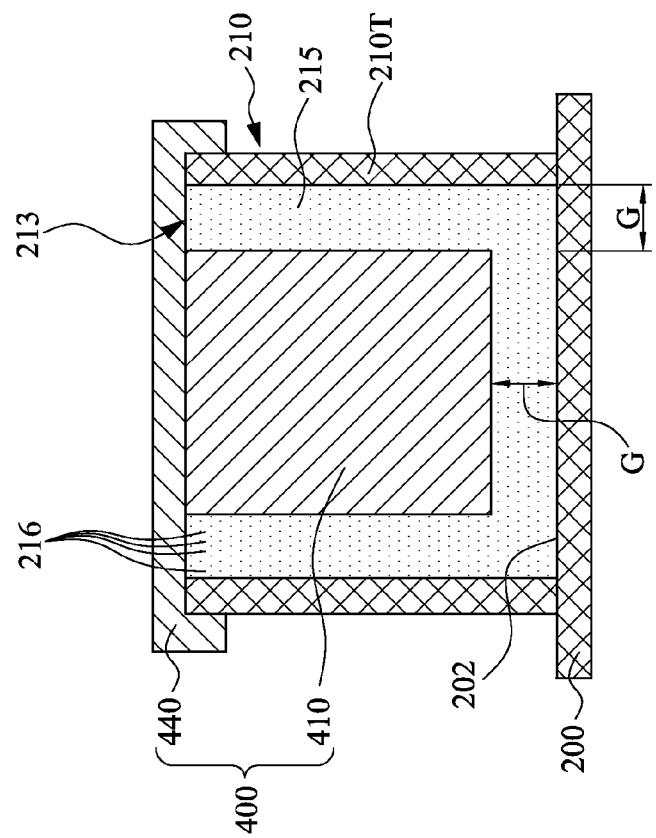
Fig. 6A
Fig. 6B

POWER CONVERSION DEVICE AND METHOD FOR ASSEMBLING THE SAME

RELATED APPLICATIONS

This application claims priority to Chinese Application Serial Number 201310612824.X, filed Nov. 26, 2013, which are herein incorporated by reference.

BACKGROUND

In recent years, the electric vehicles have achieved great improvements in the core technologies and have been gradually entering the stage of practical use and small industrialization.

As one of the key components of electric vehicle, The OBCM (on board charge module) is an electronic device mounted on board for charging battery packs. The OBCM uses input wires to receive alternative current from the AC power grid, and outputs high voltage direct current to charge the on board high voltage battery pack, and uses a communication port to maintain real-time interactive communications with a battery management system (BMS).

Due to the severe on board operation conditions, the structure and packaging design and as well as the thermal management are the key challenges for OBCM design. As some electronic components of the OBCM, such as transformers, chokes, or capacitors, are large and heavy, and these electronic components are connected to the printed wiring board by welding joints. Therefore, the vibration of the electronic components in traffic of the vehicle, fracture may occur in the welding joints, or the printed wiring board may be bended due to the gravity of the electronic components, resulting in an unacceptable quality in the electronic connection of the electronic components and the printed wiring board.

SUMMARY

This disclosure provides a power conversion device and a method for assembling the same.

In one embodiment, a method for assembling a power conversion device is provided. The method includes mounting an electronic component on the heat-dissipating base, and electrically connecting a printed wiring board with the electronic component mounted on the heat-dissipating base.

In another embodiment, a power conversion device is provided. The power conversion device includes a heat-dissipating base, a printed wiring board, an electronic component, and a fixing assembly. The electronic component is disposed between the printed wiring board and the heat-dissipating base and mounted on the heat-dissipating base. The fixing assembly fixes the electronic component and the printed wiring board, such that the electronic component and the printed wiring board are electrically connected.

The power conversion device and the method for assembling the power conversion device provided by the disclosure may be applied to all electronic devices or to the relevant technical aspects such as vehicle charger modules. Through the configuration and the method for assembling the power conversion device, the electronic component does not easily fall apart from the printed wiring board, so as to ensure the quality in the electronic connection of the electronic component and the printed wiring board.

In sum, compared to the prior art, the aforementioned embodiments may have one of the following characteristics:
1. the assembling time becomes shorter;
2. the maintenance cost is reduced; and
3. the quality in the electronic connection of the electronic component and the printed wiring board is strengthened.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 2D is a cross-sectional view viewed along line A-A of FIG. 2C;

FIG. 6A is a schematic cross-sectional view after the heat-dissipating base and the electromagnetic inductive module are assembled according to one embodiment of this disclosure;

FIG. 6B is a schematic cross-sectional view after the heat-dissipating base and the electromagnetic inductive module are assembled according to one embodiment of this disclosure;

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the disclosure. As used herein, the singular forms "a", "an" and "the" are intended to include the plural forms as well, unless the context clearly indicates otherwise.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

Figure 1:
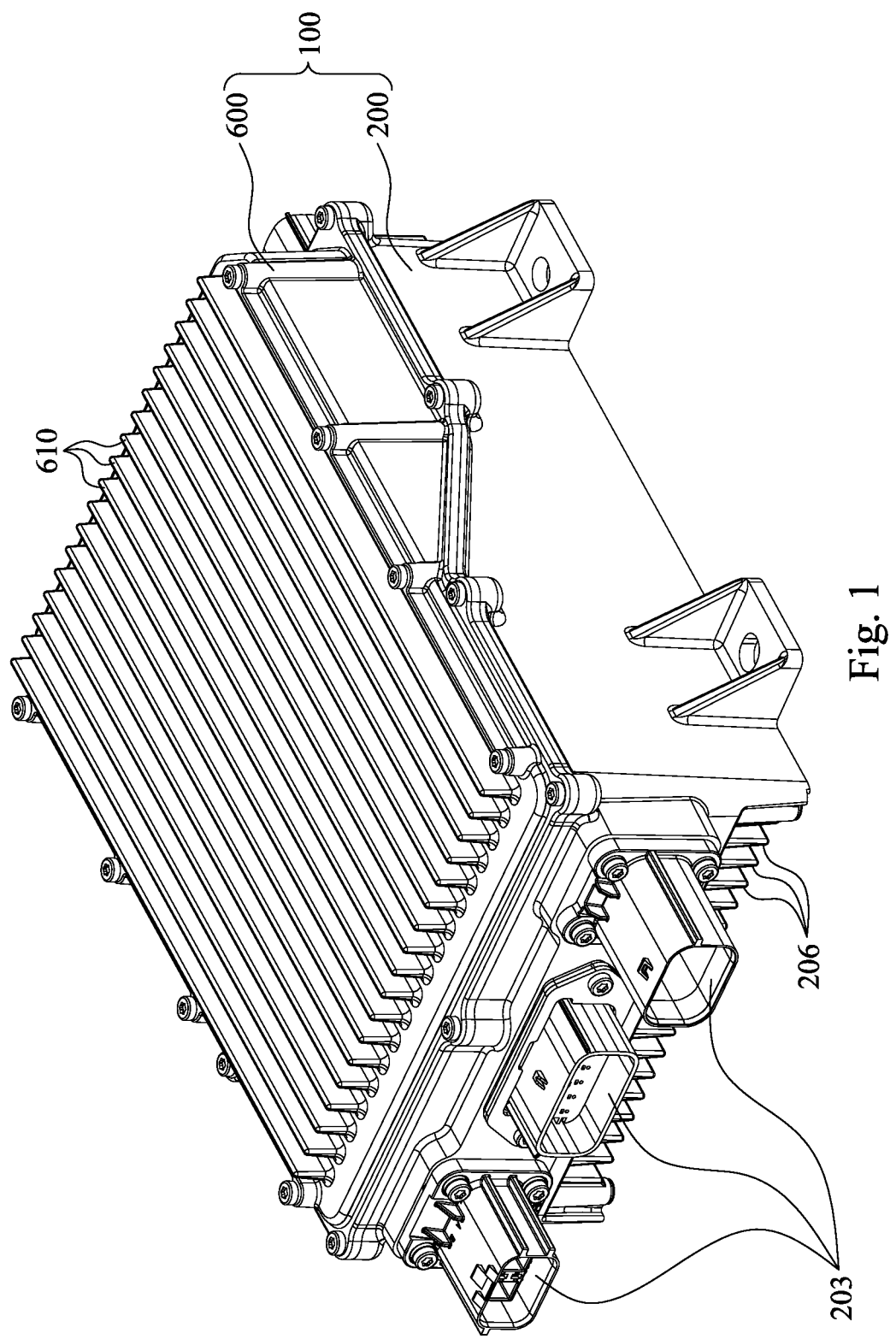
FIG. 1 is an assembly view of a power conversion device according to one embodiment of this disclosure.
Figure 2A:
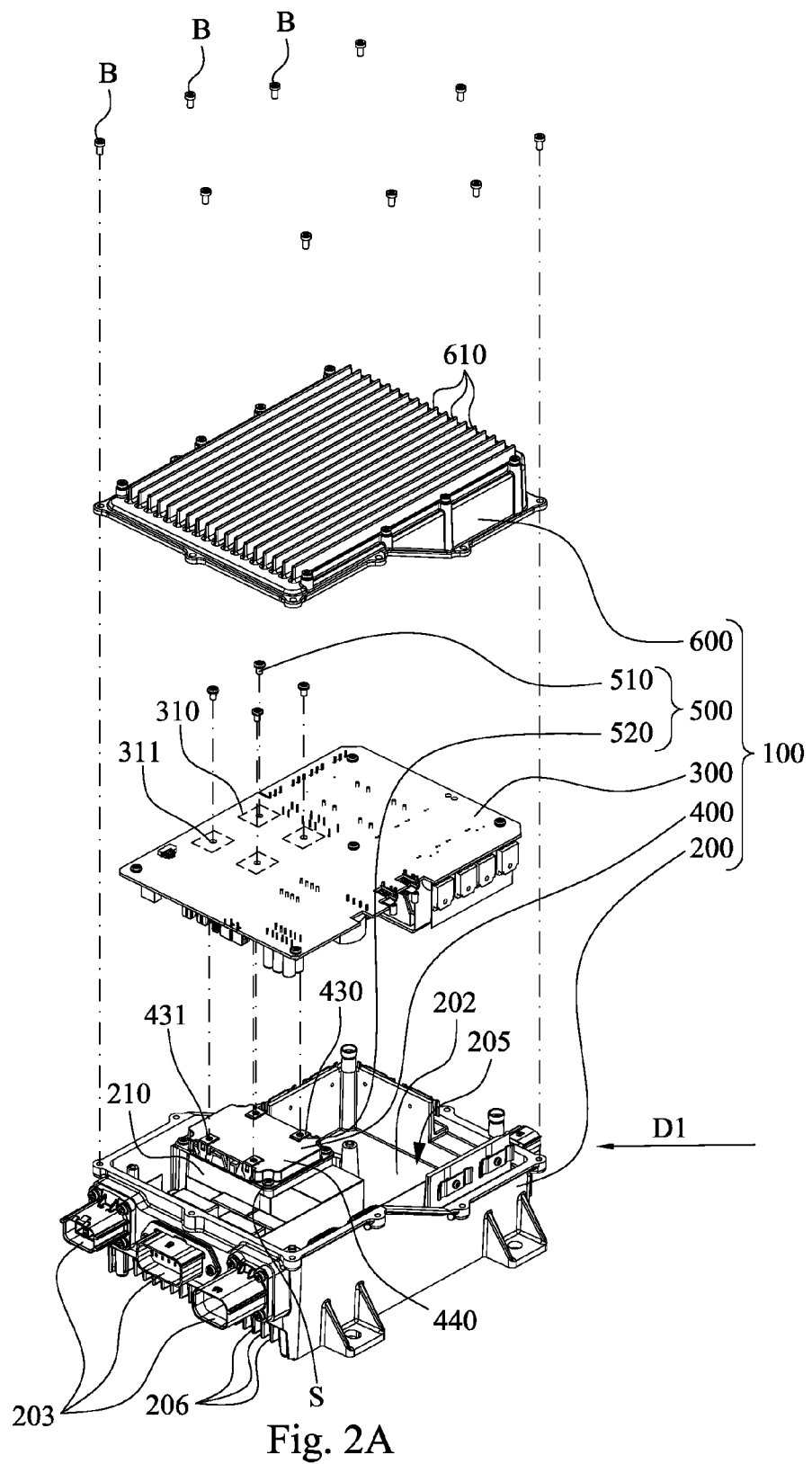
FIG. 2A is an exploded view of FIG. 1
Figure 2B:
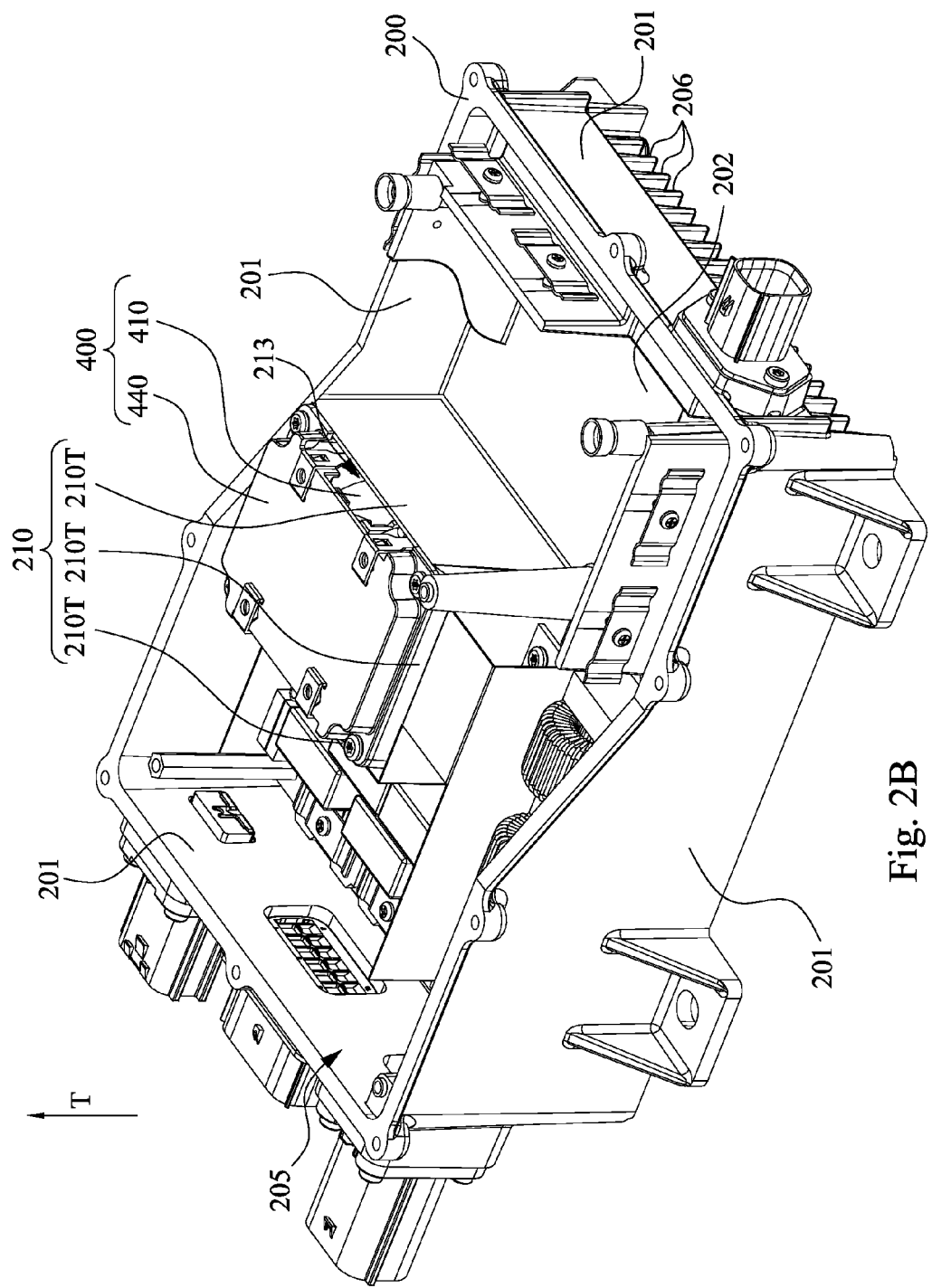
FIG. 2B illustrates a heat-dissipating base viewed along a direction D1 of FIG. 2A.
Figure 2C:
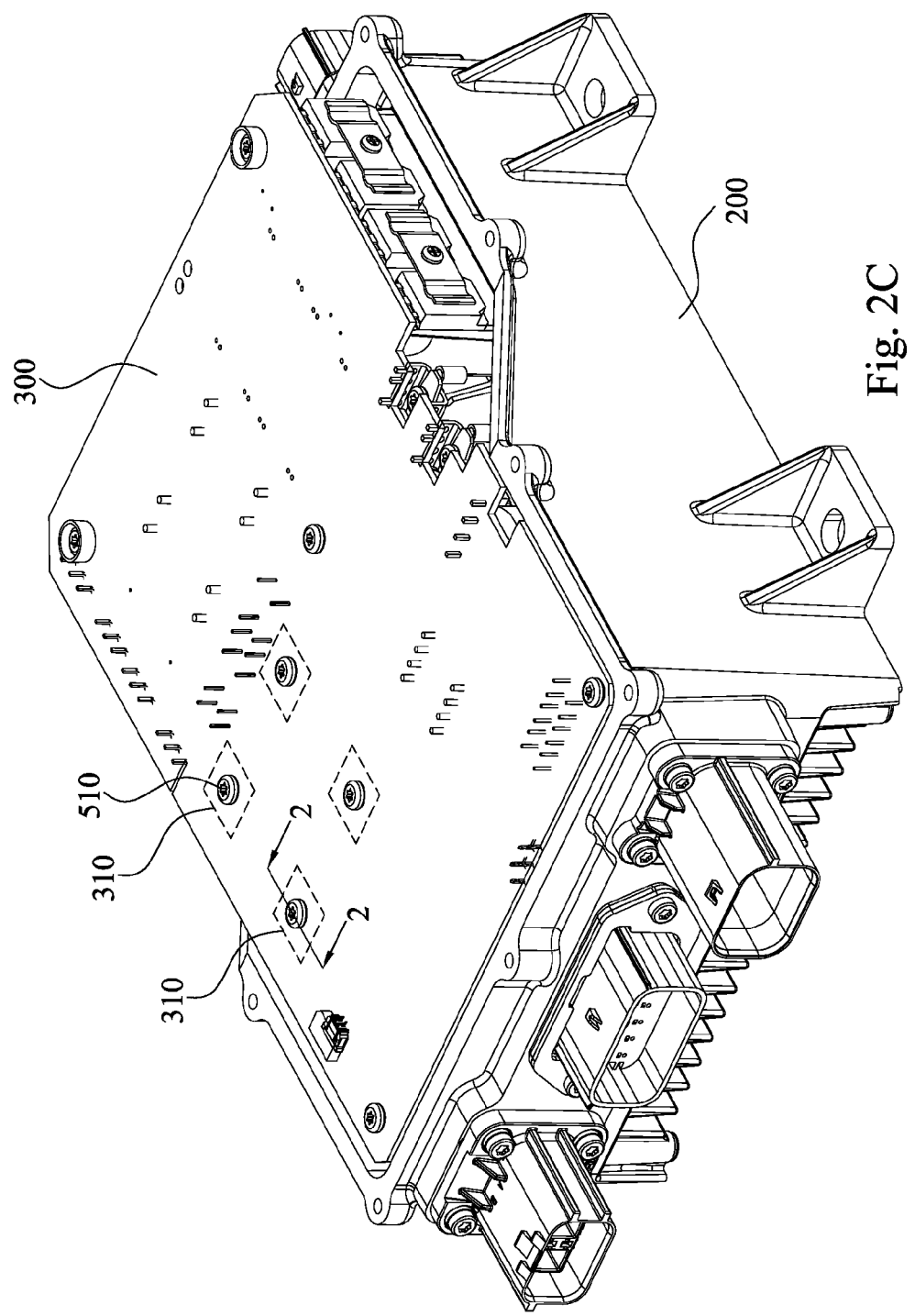
FIG. 2C is an assembly view of the heat-dissipating base and a printed wiring board of FIG. 2A.

FIG. 1 is an assembly view of a power conversion device 100 according to one embodiment of this disclosure. FIG. 2A is an exploded view of FIG. 1. FIG. 2B illustrates a heat-dissipating base 200 viewed along a direction D1 of FIG. 2A. FIG. 2C is an assembly view of the heat-dissipating base 200 and a printed wiring board 300 of FIG. 2A. As shown in FIG. 1 and FIG. 2A, a power conversion device 100 is provided. The power conversion device 100 includes a heat-dissipating base 200, a printed wiring board 300, an electromagnetic inductive module 400, and a fixing assembly 500. The electromagnetic inductive module 400 is disposed between the printed wiring board 300 and the heat-dissipating base 200 and mounted on the heat-dissipating base 200. The fixing assembly 500 fixes the electromagnetic inductive module 400 and the printed wiring board 300, such that the electromagnetic inductive module 400 and the printed wiring board 300 are electrically connected.

Therefore, the structure of the embodiment can strengthen the connection of the electromagnetic inductive module 400 and printed wiring board 300 and the connection of the electromagnetic inductive module 400 and the heat-dissipating base 200, thereby reducing the risk that the electromagnetic inductive module 400 falls apart from the printed wiring board 300 and thus damages the electronic connection due to the gravitational force or external forces, so as to maintain the quality in the electronic connection of the electromagnetic inductive module 400 and the printed wiring board 300.

Figure 3:
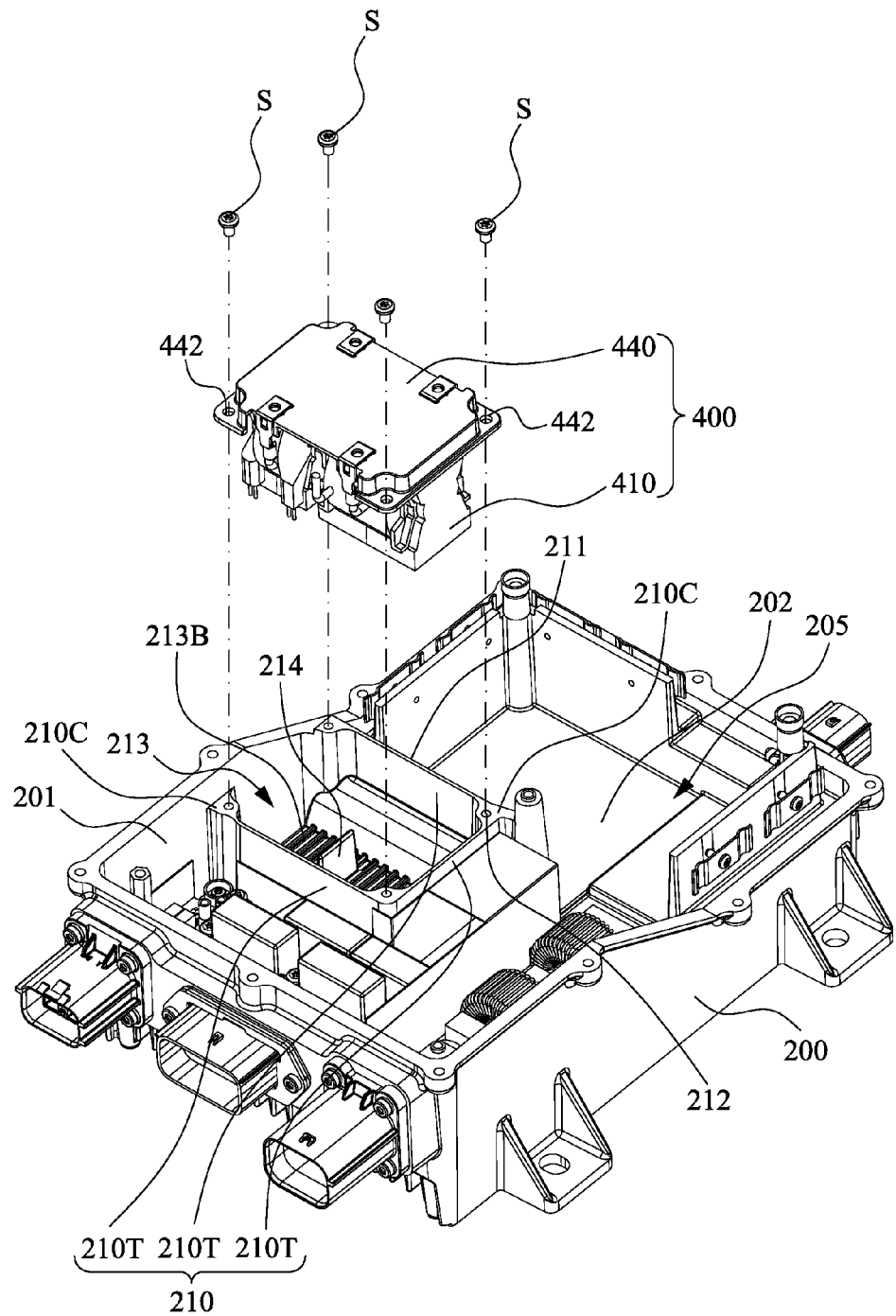
FIG. 3 is an exploded view of the heat-dissipating base and an electromagnetic inductive module of FIG. 2A.
Figure 4:
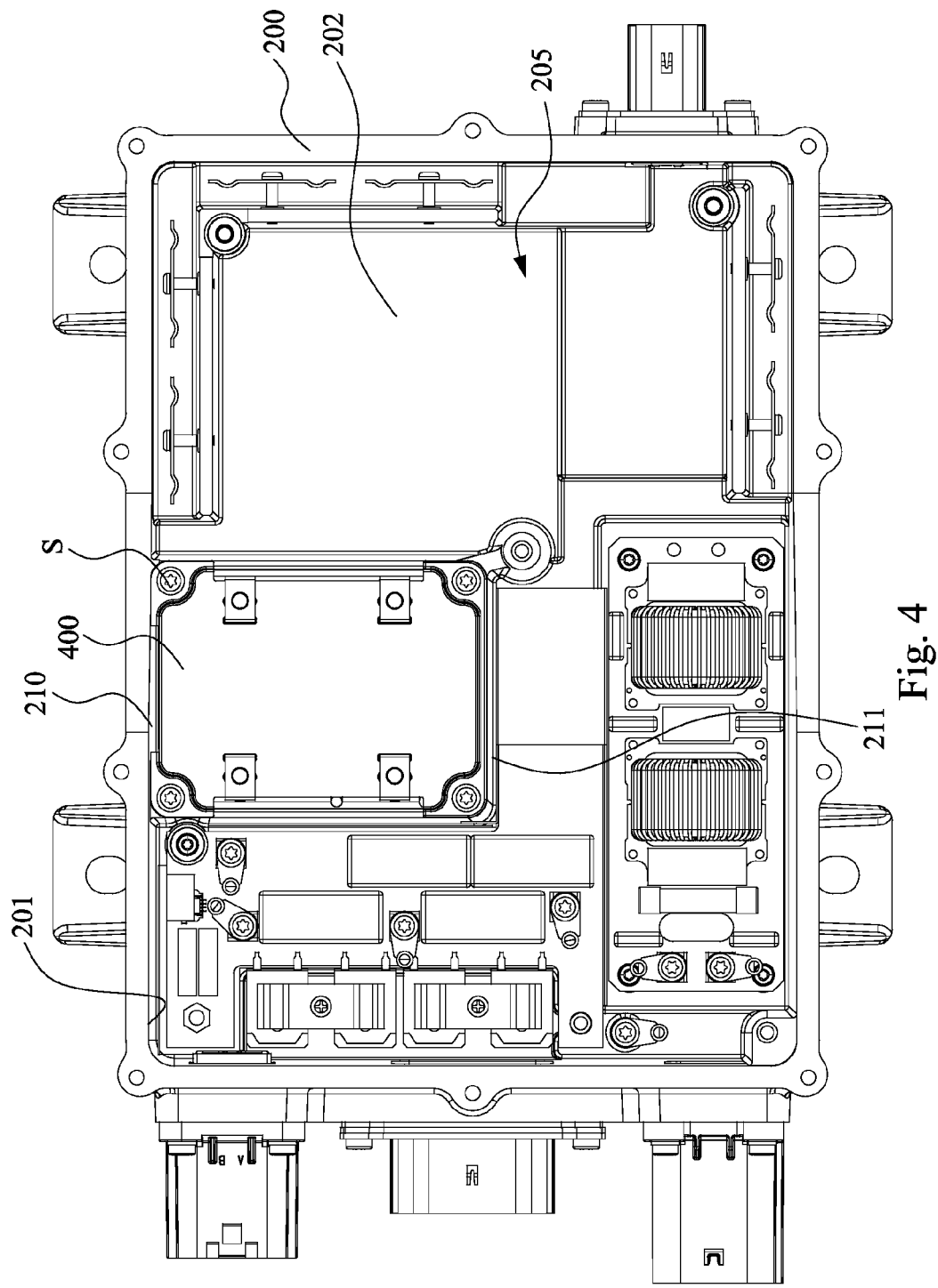
FIG. 4 is a top view of FIG. 3 after the heat-dissipating base and the electromagnetic inductive module are assembled

FIG. 3 is an exploded view of the heat-dissipating base 200 and the electromagnetic inductive module 400 of FIG. 2A. FIG. 4 is a top view of FIG. 3 after the electromagnetic inductive module 400 is assembled to the heat-dissipating base 200. As shown in FIG. 3, the heat-dissipating base 200 includes at least one three-dimensional structure 210. The three-dimensional structure 210 has an accommodation trough 213, and the accommodation trough 213 is formed by the three-dimensional structure 210. A part of the electromagnetic inductive module 400 is disposed in the accommodation trough 213 (see FIG. 2A), and the other part of the electromagnetic inductive module 400 is disposed outside the accommodation trough 213 and is fixed to the three-dimensional structure 210 and the printed wiring board 300.

As shown in FIG. 2B and FIG. 3, specifically, the heat-dissipating base 200 includes a bottom surface 202 and a plurality of side walls 201. The side walls 201 respectively extends from outer edges of the bottom surface 202 roughly in an extending direction T, and an accommodation space 205 is defined by the side walls 201 and the bottom surface 202. The three-dimensional structure 210 is disposed in the accommodation space 205, and the three-dimensional structure 210 is connected to one of the side walls 201 and the bottom surface through a thermal interface material. The thermal interface material can be a potting glue, so heat in the three-dimensional structure 210 may be dissipated through the bottom surface 202 and the side wall 201 of the heat-dissipating 200 simultaneously, so as to improve the heat-dissipating efficiency. In addition, one side of the three-dimensional structure 210 is connected to the bottom surface 202 of the heat-dissipating base 200, i.e., one side surface of the three-dimensional structure 210 faces the bottom surface 202, so a side surface of the three-dimensional structure 210 opposite to the bottom surface 202 (or a top surface 211) supports and is assembled with the electromagnetic inductive module 400. Embodiments of this disclosure are not limited thereto.

More specifically, the three-dimensional structure 210 includes a plurality of spacers 210T. The spacers 210T extend from the bottom surface 202 of the heat-dissipating base 200 in the aforementioned extending direction T and to the printed wiring board 300 (see FIG. 2B). Therefore, a top surface 211 of the three-dimensional structure 210 is a side surface formed by side surfaces of the spacers 210T opposite to the bottom surface 202 (see FIG. 3). In the embodiments, at least two spacers 210T are connected to a side wall 201, such that the spacers 210T and the side walls 201 which connected to the spacers 210T surround and form a accommodation trough 213 to accommodate the electromagnetic inductive module 400. Embodiments of this disclosure are not limited thereto. In other embodiments, the spacers can form the accommodation trough independently, i.e., the spacers are not connected to any side wall, only the spacers define the accommodation trough, or the accommodation trough is disposed in the heat-dissipating base.

In addition, as shown in FIG. 3, the spacers 210T are a portion of each other, and a corner portion 210C is formed between at least two neighboring spacers 210T. A thickness of each of the corner portions 210 is greater than a thickness of each of the spacers 210T to strengthen the structure of the three-dimensional structure 210. Embodiments of this disclosure are not limited thereto. In other embodiments, the spacers can be detachably connected to each other by assembling.

Usually, a shape of the three-dimensional structure is adjusted according to a shape of the magnetic component to accommodate the magnetic component therein. For example, in the embodiment, as shown in FIG. 3, when the shape of the electromagnetic inductive module is a cuboid or a shape similar to a cuboid, the shape of the three-dimensional structure 210 can be a cuboid or a shape similar to a cuboid. Embodiments of this disclosure are not limited thereto. People having ordinary skill in the art can make proper modification to the shape of the three-dimensional structure according to their actual needs. For example, the shape of the three-dimensional structure can be cylindrical or semi-cylindrical.

Figure 5A:
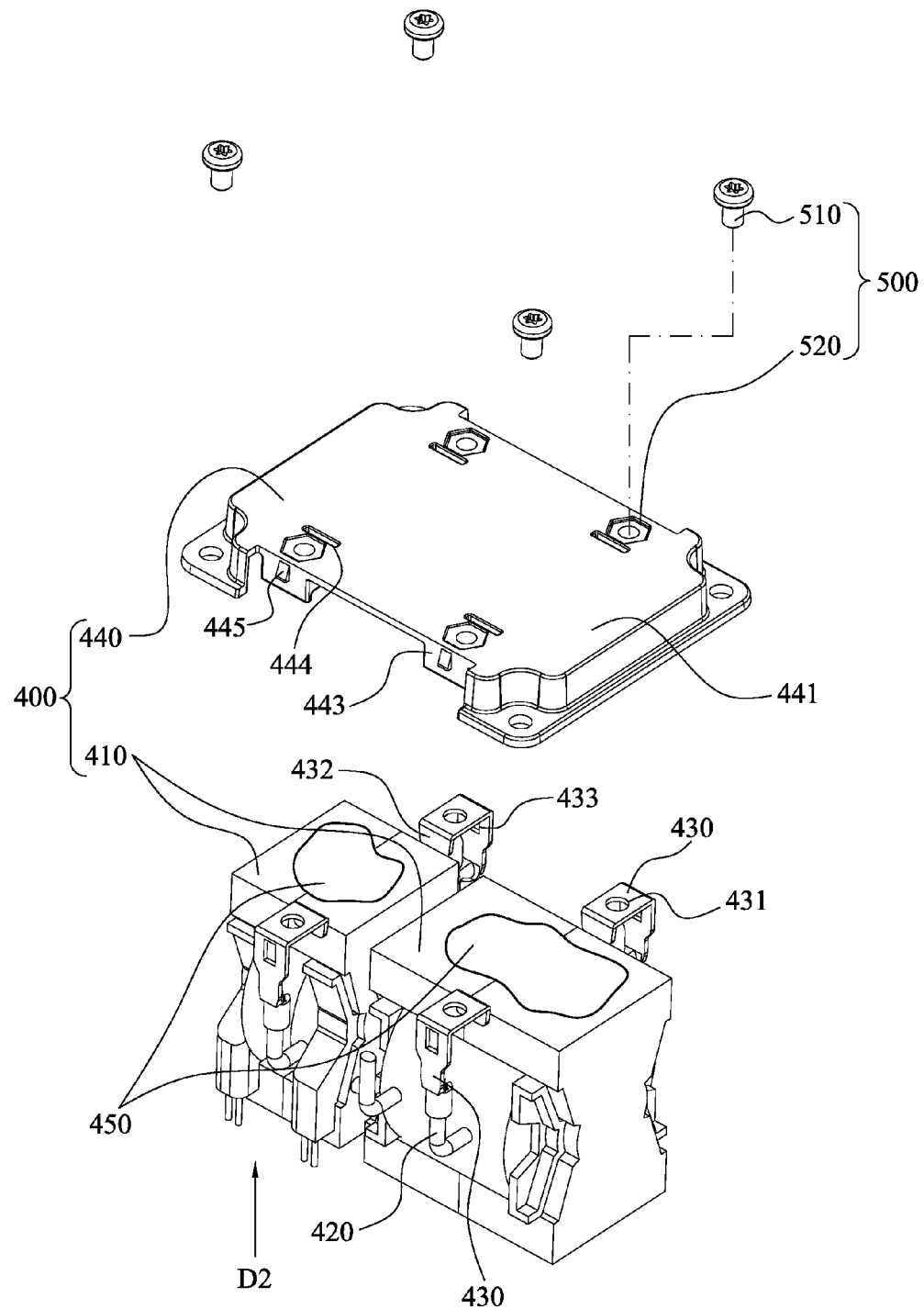
FIG. 5A is an exploded view of the magnetic component and a cover of FIG. 3.
Figure 5B:
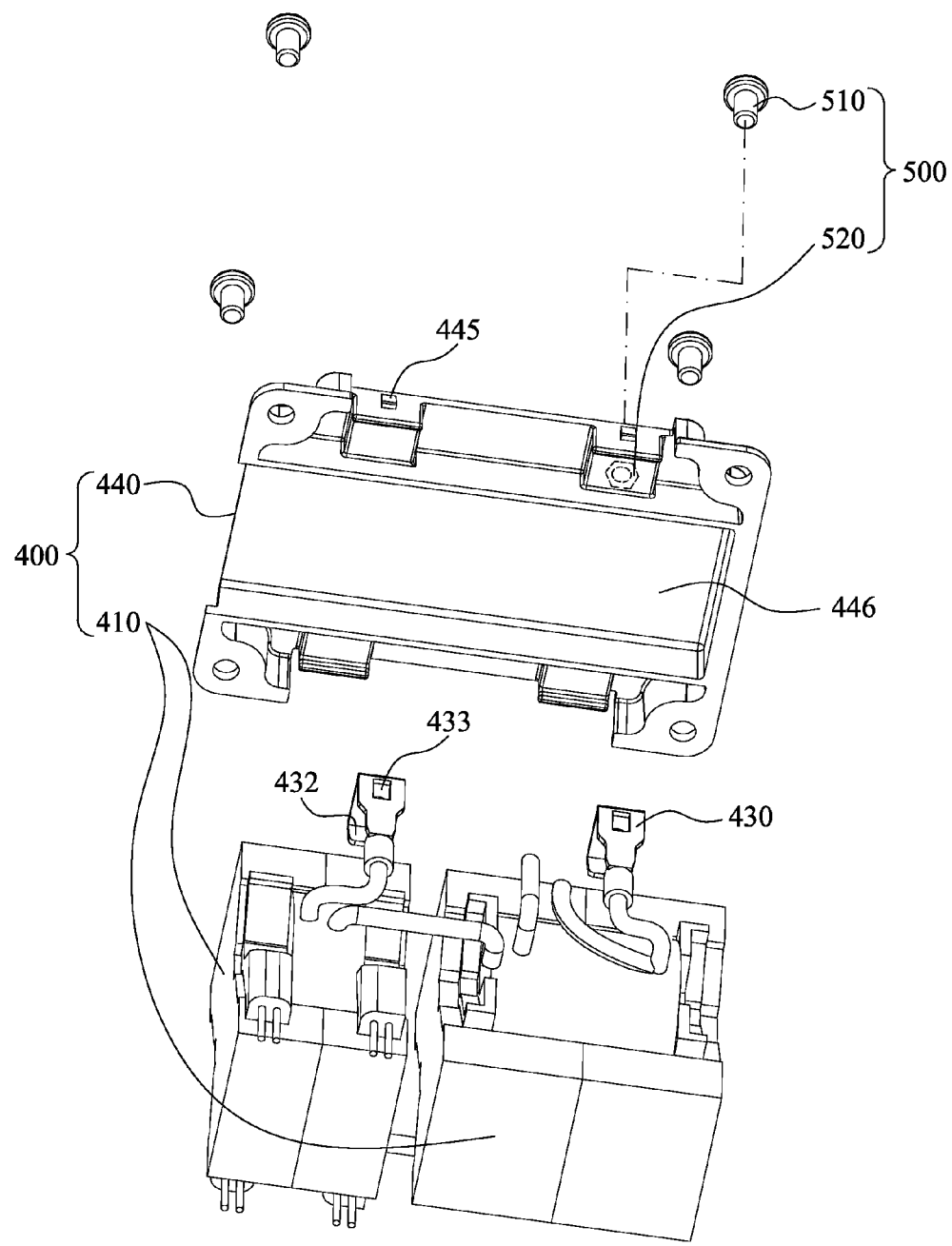
FIG. 5B is an exploded view of the magnetic component and the cover viewed along a direction D2 of FIG. 5A.

FIG. 5A is an exploded view of the magnetic component 410 and a cover 440 of FIG. 3. FIG. 5B is an exploded view of the magnetic component 410 and the cover 440 viewed along a direction D2 of FIG. 5A. As shown in FIG. 3 and FIG. 5A, the electromagnetic inductive module 400, such as a transformer and/or an inductor, includes the magnetic component 410. The magnetic component 410 is at least partially disposed in the accommodation trough 213. The magnetic component 410 is electrically connected to the printed wiring board 300 (see FIG. 2A) through the fixing assembly 500. Specifically, the electromagnetic inductive module 400 includes two magnetic components 410. The two magnetic components 410 are disposed side by side in the accommodation trough 213 (see FIG. 3) and are separated by a separating rib 214 extending from the bottom part 213B of the accommodation trough 213 to improve the heat-dissipating efficiency and avoid a short circuit. More specifically, each of the magnetic components 410 includes a core, a bobbin, a coil, and so on. A column of the core is disposed in the bobbin, and the coil wounds around the bobbin. The detailed configuration of the core, the bobbin, and the coil is known in the prior art, so it will not be described in the following.

The electronic magnetic module 400 further includes a cover 440. The cover 440 covers the accommodation trough 213 (see FIG. 2A). As shown in FIG. 5A and FIG. 5B, the cover 440 is assembled with the magnetic component 410. For example, an assembling surface 446 (see FIG. 5B) of the cover 440 is assembled with the magnetic component 410 by an adhesive glue 450. In addition, the cover 440 is physically fixed to the printed wiring board 300 by the fixing assembly 500, so the cover 440 is disposed between and connected to the printed wiring board 300 and the magnetic component 410 (see FIG. 2A). A material of the cover 440 can be an insulating material or a metal with insulating surfaces. Embodiments of this disclosure are not limited thereto. In other embodiments, the cover may be omitted, and the electromagnetic inductive module can be fixed in the accommodation trough only through the potting glue.

Specifically, as shown in FIG. 2A, in the embodiment, the printed wiring board 300 further includes a plurality of electronic components, such as transistors or capacitors, and the power conversion device 100 is connected to the system device through an input port, an output port, and a communication port mounted on the heat-dissipating base 200, so as to achieve power conversion and power management. The printed wiring board 300 further includes a plurality of first connecting portions 310. The first connecting portions 310 are respectively and electrically connected to one of the electronic components. Each of the first connecting portions 310 has a first through hole 311. As shown in FIG. 5A, each of the magnetic components 410 has a plurality of wires 420. Each of the wires 420 is electrically connected to a second connecting portion 430, and each of the second connecting portions 430 has a second through hole 431. The fixing assembly 500 includes, for example, a first fixing member 510 (a bolt, for example) and a second fixing member 520 (a nut, for example) corresponding to each other. The second fixing member 520 is embedded in a surface (or a top surface 441) of the cover 440 opposite to the assembling surface 446 (see FIG. 5B). Embodiments of this disclosure are not limited thereto. People having ordinary skill in the art can make proper modification to the fixing assembly according to their actual needs.

FIG. 2D is a cross-sectional view viewed along line A-A of FIG. 2C. As shown in FIG. 2D, when the electromagnetic inductive device 400 is fixed to the printed wiring board 300, the second connecting portion 430 is clamped between the second fixing member 520 (a nut, for example) and the first connecting portion 310, and the first fixing member 510 (a bolt, for example) passes the first through hole 311 and the second through hole 431 and is coupled with the second fixing member 520 (a nut, for example). During the coupling, the second fixing member 520 presses the second fixing member 430 toward the first connecting portion 310, such that the second connecting portion 430 is electrically connected to the first connecting portion 310.

In order to align the second connecting portion 430 to the second fixing member 520, as shown in FIG. 5A, the second connecting portion 430 is U-shaped, and two opposite end surfaces respectively have a first fixing portion 432 (a flange or a groove, for example) and a second fixing portion 433 (a flange or a groove, for example). The cover 440 includes a third fixing portion 444 (a flange or a groove, for example) and a fourth fixing portion 445 (a flange or a groove, for example). The third fixing portion 444 is disposed on the top surface 441 of the cover 440 and corresponds to the first fixing portion 432. The fourth fixing portion 445 is disposed on an adjacent surface 443 of the cover 440 adjacent to the top surface 441. The adjacent surface 443 is not coplanar with the top surface 441. The fourth fixing portion 445 corresponds to and is fixed to the second fixing portion 433.

Therefore, when the cover 440 is covered on one surface of the magnetic component 410 and the second connecting portion 430 is disposed on the second fixing member 520 (a nut, for example), as shown in FIG. 2D, the second connecting portion 430 is three-dimensionally fixed to the cover 440 due to the coupling of the first fixing portion 432 (a flange, for example) with the third fixing portion 444 (a groove, for example) and the coupling of the second fixing portion 433 (a groove, for example) with the fourth fixing portion 445 (a flange, for example).

In addition, in order to stably fix the cover 440 to the three-dimensional structure 210, as shown in FIG. 3, in the embodiment, the cover 440 is covered on the accommodation trough 213 and is fixed to the three-dimensional structure 210 by a fixing structure. For example, the top surface 211 formed by the surfaces of the spacers 210T of the three-dimensional structure 210 opposite to the bottom surface 202 has a plurality of first tapped holes 212. Each of the first tapped holes 212 is disposed in the corner portion 210C. The cover 440 has a plurality of second tapped holes 442. When the cover 440 is covered on the top surface 211 of the three-dimensional structure 210, the first tapped holes 212 is aligned to the second tapped holes 442. At this time, after the bolts S pass the second tapped holes 442 and are fixed in the first tapped holes 212, the cover 440 is fixed to the top surface 211 of the three-dimensional structure 210, i.e., the cover 440 is fixed to the accommodation trough 213.

Embodiments of this disclosure are not limited thereto. People having ordinary skill in the art can use an engaging member and an engaging groove corresponding to each other, an embedding member and an embedding groove corresponding to each other, a latch and a slot corresponding to each other, or another known fixing method as the fixing structure according to their actual needs.

FIG. 6A is a schematic cross-sectional view after the heat-dissipating base 200 and the electromagnetic inductive module 400 are assembled according to one embodiment of this disclosure. As shown in FIG. 6A, the embodiment is similar to the aforementioned embodiment. In order to improve the heat-dissipating efficiency, the embodiment further has the following technical characteristics. A potting glue body 215 is filled in the accommodation trough 213, and the potting glue body 215 is filled in a gap G between the magnetic component 410 disposed in the accommodation trough 213 and the three-dimensional structure 210. Specifically, the magnetic component 410 is disposed in the accommodation trough 213, and the gap is located not only between the spacers 210T and the magnetic component 410 but also between the bottom surface 202 of the heat-dissipating base 200 and the magnetic component 410. Therefore, the potting glue body 215 not only dissipates the heat generated by the magnetic component 410 to the heat-dissipating base 200 but also coats the magnetic component 410 to stably fix the magnetic induction module 400 in the accommodation trough 213.

In on embodiment, when the energy loss is large, or the energy loss of the coil is larger than the magnetic depletion, people having ordinary skill in the art may entirely fill the gap G between the magnetic component 410 and the three-dimensional structure 210 with the potting glue body 215 according to their actual needs.

Embodiments of this disclosure are not limited thereto. In other embodiments, the potting glue body 215 may not be entirely filled in the gap between the magnetic component 410 and the three-dimensional structure 210. FIG. 6B is a schematic cross-sectional view after the heat-dissipating base 200 and the electromagnetic inductive module 400 are assembled according to one embodiment of this disclosure. As shown in FIG. 6B, when the energy loss is small, or the energy loss of the coil is smaller than the magnetic depletion, people having ordinary skill in the art may partially fill the gap G between the magnetic component 410 and the three-dimensional structure 210 with the potting glue body 215 according to their actual needs, such that the potting glue body 215 disposed in the accommodation trough 213 has a height H1 smaller than a height H2 of the electromagnetic inductive module 400. For example, the height H1 of the potting glue body 215 disposed in the accommodation trough 213 is a half of the height H2 of the electromagnetic inductive module 400. Specifically, the magnetic component 410 is disposed in the accommodation trough 213, and the gap is located not only between the spacers 210T and the magnetic component 410 but also between the bottom surface 202 of the heat-dissipating base 200 and the magnetic component 410.

As shown in FIG. 6A, in order to improve the heat-dissipating efficiency, in the embodiment, there are many thermally conductive particles 216 in the potting glue body 215. Materials of the thermally conductive particles 216 can be carbon, metal, or a diamond-like material. Embodiments of this disclosure are not limited thereto. There may be no thermally conductive particles in the potting glue body.

In order to improve the heat-dissipating efficiency, as shown in FIG. 2A, a first fin 206 may be disposed on a surface of the heat-dissipating base 200 opposite to the bottom surface 202. In addition, in the embodiment, the power conversion device 100 further includes a heat-dissipating cover 600. The heat-dissipating cover 600 covers the heat-dissipating base 200. Specifically, the heat-dissipating cover 600 is fixed to the heat-dissipating base 200 through screws B to cover the accommodation space 205, such that the printed wiring board 300 and the electromagnetic inductive module 400 are accommodated between the heat-dissipating cover 600 and the heat-dissipating base 200. The heat-dissipating cover 600 further includes a second fin 610 to improve the heat-dissipating efficiency. A material of the heat-dissipating base 200 can be thermally conductive metal or a thermally conductive non-metallic material. Embodiments of this disclosure are not limited thereto.

As shown in FIG. 2B, when the energy loss is larger, the three-dimensional structure 210 of the embodiment can be an integrated three-dimensional structure 210 which is a portion of the heat-dissipating base 200 to improve the heat-dissipating efficiency. Specifically, the spacers 210T are a portion of the bottom surface 202 of the heat-dissipating base 200 and directly extend from the bottom surface 202 of the heat-dissipating base 200. More specifically, at one embodiment, at least two spacers 210T are a portion of the side wall 201 connected to the three-dimensional structure 210, such that the spacers 210T and the side wall 201 connected to the three-dimensional structure 210 surround the accommodation trough 213 together. Therefore, the bottom surface 202 of the heat-dissipating base 200, the side wall 201, and the spacers 210T of the three-dimensional structure 210 all can be heat-dissipating surfaces to dissipating heat. When the heat is generated, the heat is dissipated through outer surfaces of the spacers 210T, the bottom surface 202 of the heat-dissipating base 200, and the side wall 201 to other parts of the heat-dissipating base 200, thereby improving the heat-dissipating efficiency.

Specifically, in one embodiment, the spacers 210T are a portion of the bottom surface 202 of the heat-dissipating base 200 and directly extend from the bottom surface 202 of the heat-dissipating base 200 to surround the accommodation trough 213 together. Therefore, the bottom surface 202 of the heat-dissipating base 200 and the spacers 210T of the three-dimensional structure 210 all can be the heat-dissipating surfaces to dissipating the heat. When the heat is generated, the heat is dissipated through outer surfaces of the spacers 210T and the bottom surface 202 of the heat-dissipating base 200 to other parts of the heat-dissipating base 200, thereby improving the heat-dissipating efficiency.

Figure 7A:
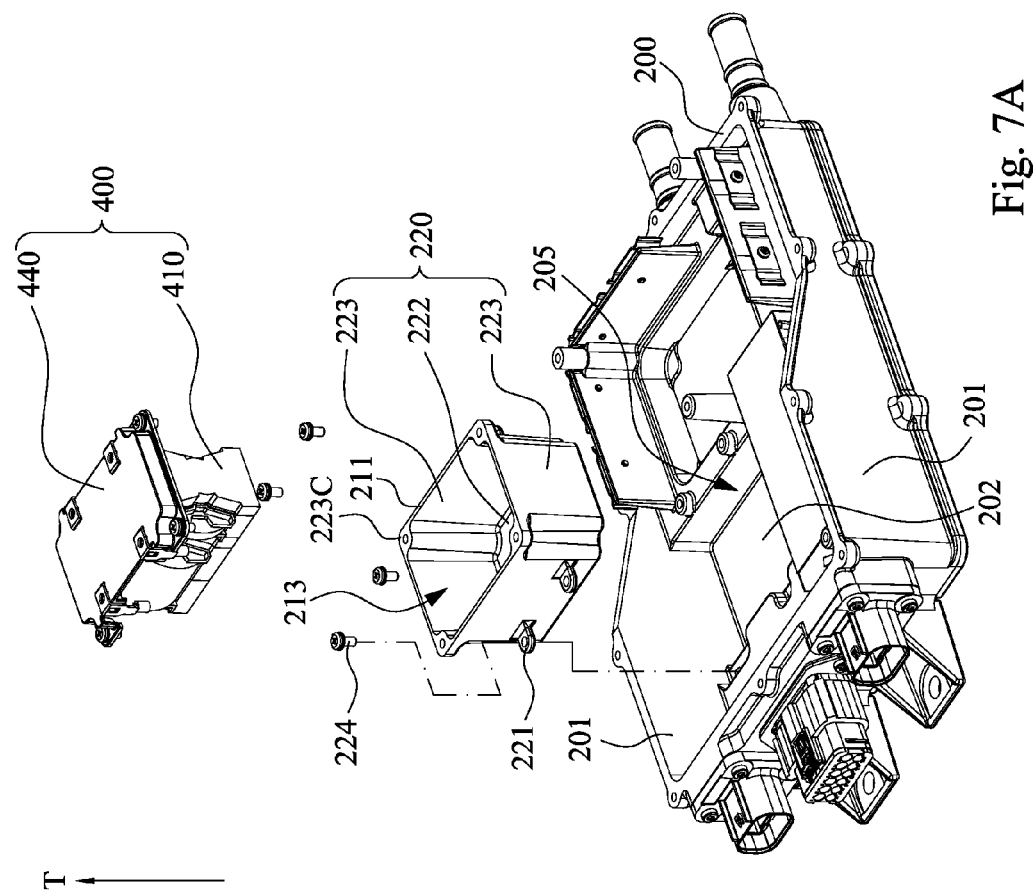
FIG. 7A is an exploded view of the heat-dissipating base, an independent three-dimensional structure, and the electromagnetic inductive module according to one embodiment of this disclosure.
Figure 7B:
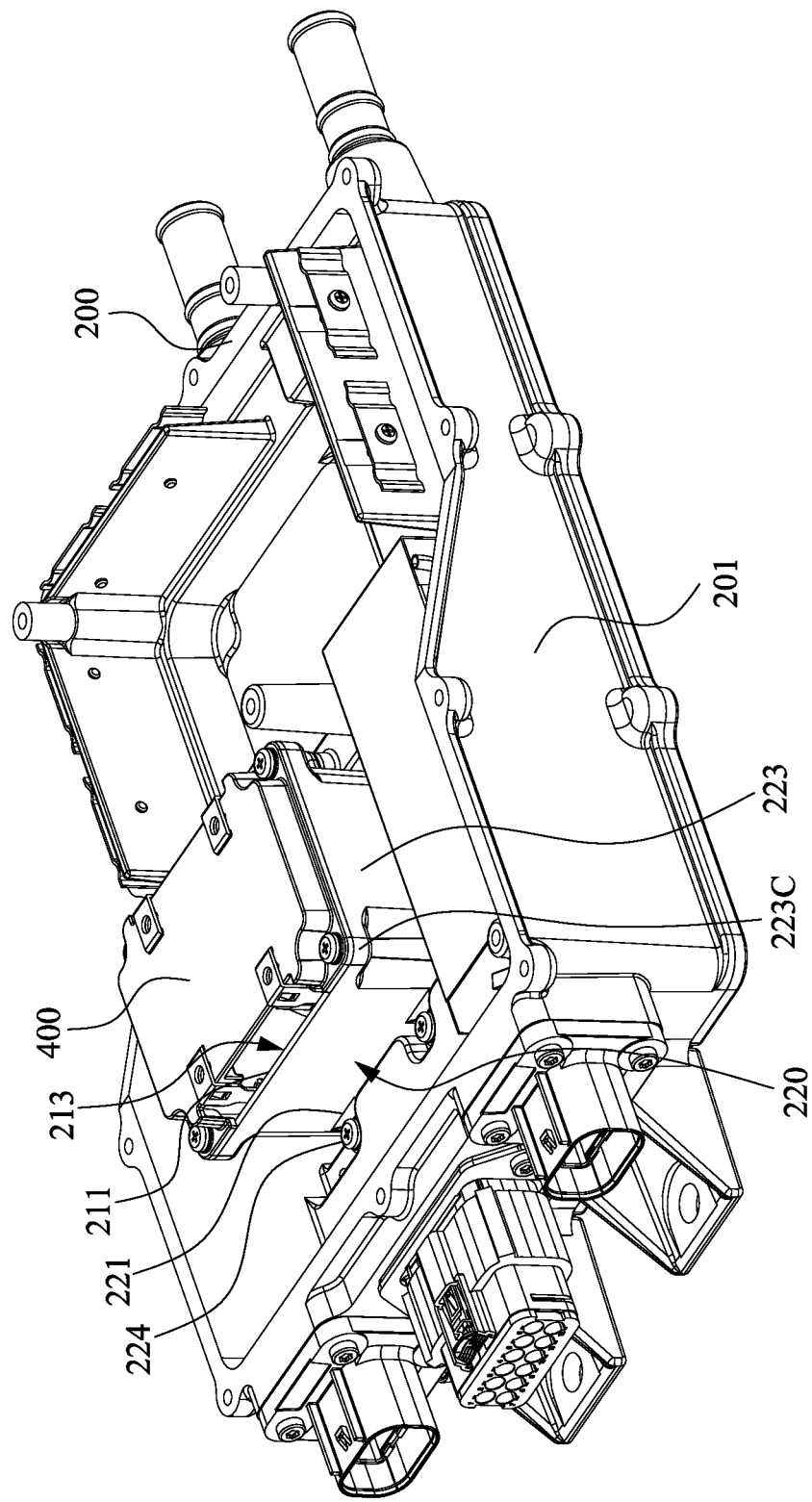
FIG. 7B is an assembled view of FIG. 7A.

The three-dimensional structure 210 is not limited to the integrated three-dimensional structure 210. In other embodiments, the three-dimensional structure 210 may be an independent three-dimensional structure 220. FIG. 7A is an exploded view of the heat-dissipating base 200, an independent three-dimensional structure 220, and the electromagnetic inductive module 400 according to one embodiment of this disclosure. FIG. 7B is an assembled view of FIG. 7A. As shown in FIG. 7A and FIG. 7B, the embodiment is similar to the aforementioned embodiment, but the three-dimensional structure is an independent three-dimensional structure 220 in the embodiment. The independent three-dimensional structure 220 is detachably disposed on the heat-dissipating base 200. As shown in FIG. 7A, after the independent three-dimensional structure 220 is independently manufactured, the independent three-dimensional structure 220 is disposed in the accommodation space 205 and is assembled to the bottom surface 202 of the heat-dissipating base 200. For example, one side surface of the independent three-dimensional structure 220 faces the bottom surface 202, so a side surface of the independent three-dimensional structure 220 opposite to the bottom surface 202 (the top surface 211) supports and is assembled with the electromagnetic inductive module 400. Then, the three-dimensional structure 220 is assembled to the bottom surface 202 of the heat-dissipating base 200 through screws 224 and fixing lugs 221. Correspondingly, one side of the independent three-dimensional structure 220 is assembled to the bottom surface 202 of the heat-dissipating base 200.

Specifically, the independent three-dimensional structure 220 is box-shaped and includes a bottom board 222 and a plurality of side boards 223. The side boards 223 extend from the bottom board 222 in the extending direction T, so the top surface 211 of the independent three-dimensional structure 220 is a side surface formed by the side board 223 opposite to the bottom board together. In the embodiment, the bottom board 222 and the side board 223 surround and form the accommodation trough 213. The fixing lugs are disposed on outer surfaces of the two opposite side boards 223 and extend outwardly along a direction away from the accommodation trough 213. In addition, the bottom board 222 and the side boards 223 are a portion of each other, and every two of the side boards 223 form a corner portion 223C. A thickness of each of the corner portions 223C is larger than a thickness of each of the side boards 223 to strengthen the structure of the independent three-dimensional structure 220. Embodiments of this disclosure are not limited thereto. In other embodiments, the side boards can be detachably connected to each other by assembling. Therefore, the bottom board 222 of the independent three-dimensional structure 220 and the side boards 223 can be heat-dissipating surfaces. When the independent three-dimensional structure 220 is assembled to the heat-dissipating base 200, the heat generated can be dissipated through the independent three-dimensional structure 220 to other parts of the heat-dissipating base 200, thereby improving the heat-dissipating efficiency.

Usually, a shape of the independent three-dimensional structure is adjusted according to the shape of the magnetic component, so as to accommodate the magnetic component therein. For example, in the embodiment, as shown in FIG. 7A, the shape of the magnetic component 410 is a cuboid or a shape similar to a cuboid. Embodiments of this disclosure are not limited thereto. People having ordinary skill in the art can make proper modification to the shape of the independent three-dimensional structure according to their actual needs. For example, the shape of the independent three-dimensional structure can be cylindrical or semi-cylindrical. The potting glue can be filled before the independent three-dimensional structure 220 is assembled to the heat-dissipating base 220.

Figure 8:
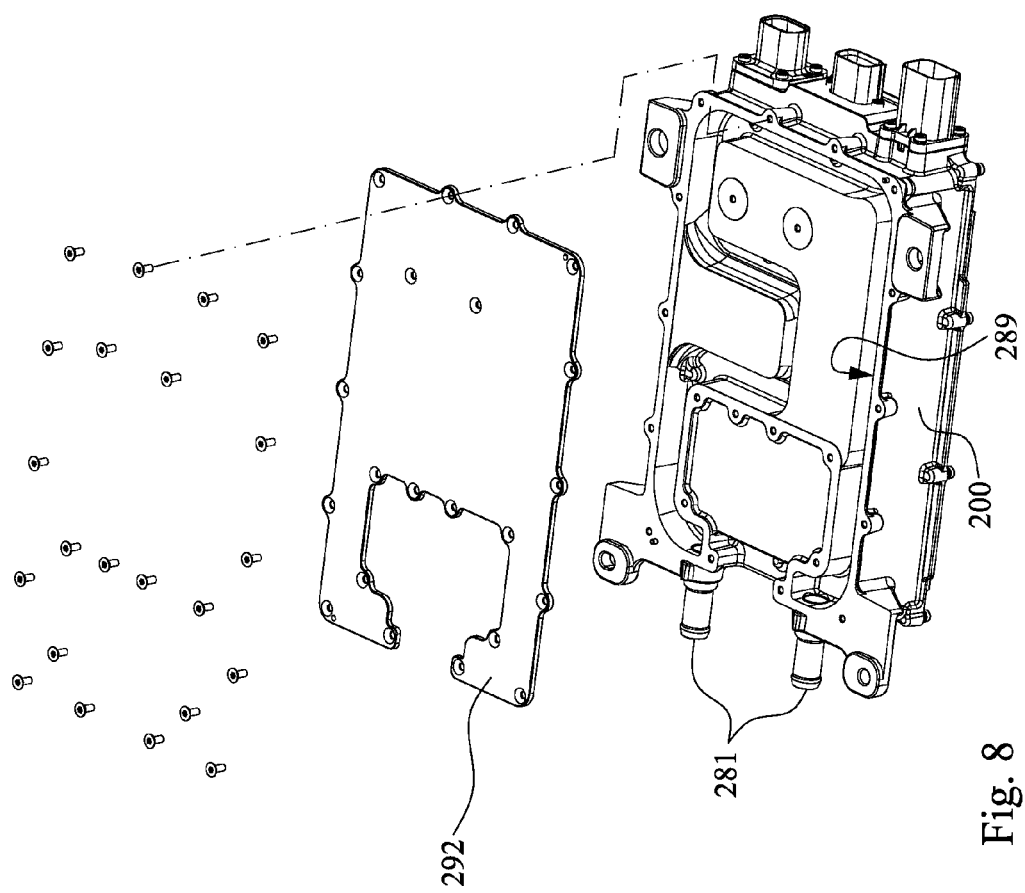
FIG. 8 is an exploded view of the heat-dissipating base according to one embodiment of this disclosure.

In order to improve the heat-dissipating efficiency, the heat-dissipating base can be liquid-cooled heat-dissipating base, air-cooled heat-dissipating base, or a combination of the two. FIG. 8 is an exploded view of the heat-dissipating base 200 according to one embodiment of this disclosure. As shown in FIG. 8, the embodiment is similar to the aforementioned embodiments. Specifically, the heat-dissipating base 200 is a liquid-cooled heat-dissipating base and is hollow, and cooling fluid flows in the heat-dissipating base 200. By the cooling fluid flowing in the liquid-cooled heat-dissipating base, the heat-dissipating efficiency is improved. More specifically, the heat-dissipating base 200 further includes a cooling fitting 281 and a fluid passage 289. The fluid passage 289 is disposed on the back of the heat-dissipating base 200, and a passage for cycling the cooling fluid is formed after a bottom board 292 is covered. The cooling fitting 281 is disposed on one side of the heat-dissipating base 200 and is connected to the fluid passage 289 in the heat-dissipating base 200. The cooling fitting 281 provides the cooling fluid an inlet to enter the fluid passage 289 and an outlet to exit the fluid passage 289. The fluid passage 289 bypasses around electronic components, such as electromagnetic inductive module, in the heat-dissipating base 200 to provide fluid paths for the cooling fluid, so as to improve the heat-dissipating efficiency of the heat-dissipating base 200. People having ordinary skill in the art can make proper modification to the shape of the fluid passage according to their actual needs.

Figure 9:
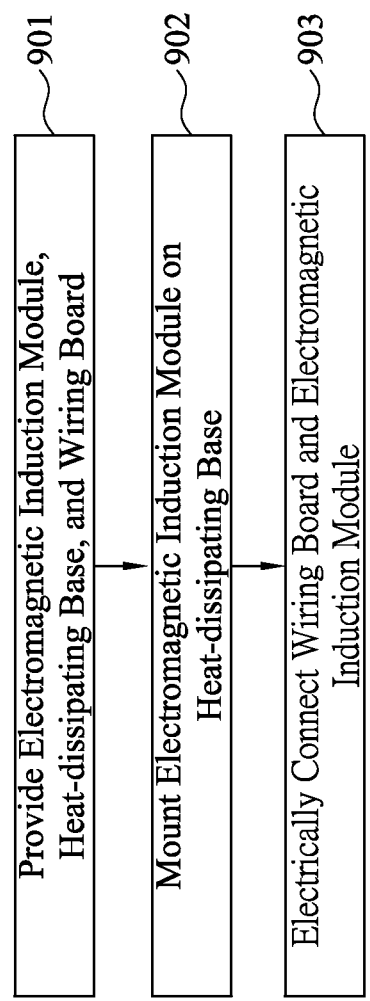
FIG. 9 is a flowchart of a method for assembling the power conversion device according to one embodiment of this disclosure.

FIG. 9 is a flowchart of a method for assembling the power conversion device 100 according to one embodiment of this disclosure. As shown in FIG. 2A and FIG. 9, a method for assembling the power conversion device 100 is provided. The method includes the following steps. Step 901 is providing the electromagnetic inductive module 400, the heat-dissipating base 200, and the printed wiring board 300. Step 902 is mounting the electromagnetic inductive module 400 on the heat-dissipating base 200. Step 903 is electrically connecting the printed wiring board 300 and the electromagnetic inductive module 400.

Therefore, because in the method of the embodiment, the printed wiring board 300 is electrically to the electromagnetic inductive module 400 after the electromagnetic inductive module 400 is mounted on the heat-dissipating base 200, compared to the prior art, in which the electromagnetic inductive module is mounted on the heat-dissipating base after the electromagnetic inductive module is electrically connected to the printed wiring board, the situation that the electromagnetic inductive module falls apart from the printed wiring board and thus damages the electronic connection due to the gravitational force or external forces is avoided, such that the quality in the electronic connection of the electromagnetic inductive module 400 and the printed wiring board 300 is improved and that the reliability of the connection is improved.

Step 901 further includes the following detailed operations. As shown in FIG. 3 and FIG. 5A, the cover 440 is covered on the magnetic components 410 of the electromagnetic inductive module 400 before the electromagnetic inductive module 400 is disposed in the accommodation trough 213. Then the second connecting portions 430 of the magnetic components 410 are aligned to the second fixing members 520 of the cover 440. Specifically, as shown in FIG. 2D, the second connecting portions 430 are moved to the second fixing members 520 of the cover 440, and then the second connecting portions 430 are aligned to the second fixing members 520 through the embedment of the fixing portion 432 and 433 of the connecting portion 430 and the fixing portion 444 and 445 of the cover 440.

Figure 10A:
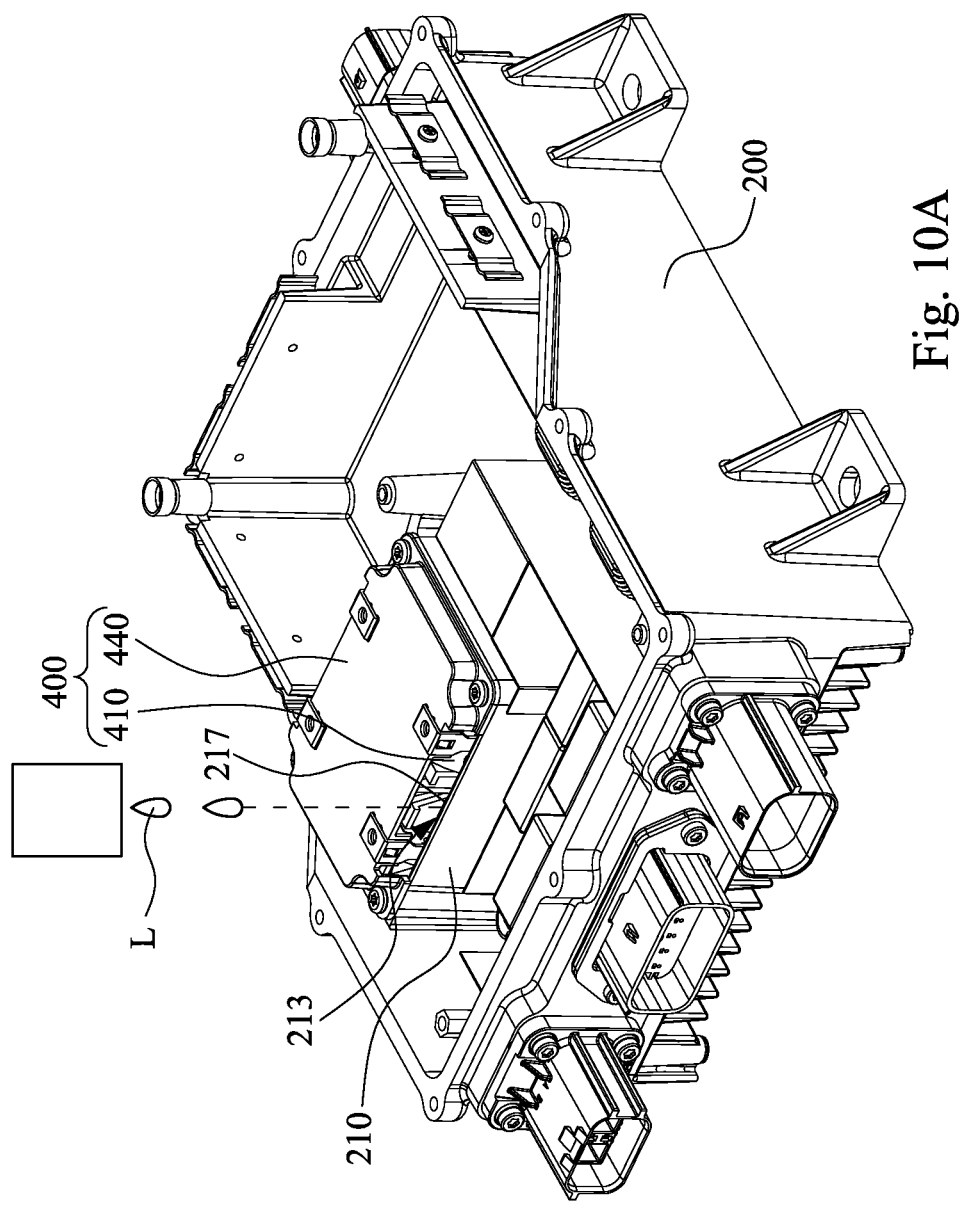
FIG. 10A is a perspective view illustrating that a potting glue is filled between the three-dimensional structure and the magnetic component.

Step 902 further includes the following detailed operations. FIG. 10A is a perspective view illustrating that the potting glue L is filled between the three-dimensional structure 210 and the magnetic component 410. As shown in FIG. 3, the electromagnetic inductive module 400, which is not assembled to the printed wiring board 300, is disposed in the accommodation trough 213 of the heat-dissipating base 200. Then, as shown in FIG. 10A, the potting glue L is filled into a gap between the three-dimensional structure 210 and the magnetic components 410.

Specifically, as shown in FIG. 10A, when the electromagnetic inductive module 400 is disposed in the three-dimensional structure 210, the cover 440 is covered on and fixed to the three-dimensional structure 210 after the magnetic components 410 is disposed in the accommodation trough 213, such that a narrow seam 217 is formed between the cover 440 and the three-dimensional structure 210 and that a gap is formed between the magnetic components 410 disposed in the accommodation trough 213 of the three-dimensional structure 210 and inner surfaces of the three-dimensional structure 210. When the potting glue L is filled into the accommodation trough 213, the potting glue L can be filled into the accommodation trough 213 through the narrow seam 217, such that the potting glue L is filled in the gap between the magnetic components 410 and the accommodation trough 213. The detailed operations of step 902 may be applied in the situation that a size of an opening of the accommodation trough 213 is larger in an assembling environment with poor visibility. Embodiments of this disclosure are not limited thereto.

After the step of filling the potting glue L into the gap between the three-dimensional structure 210 and the magnetic components 410, the embodiment further includes placing the accommodation trough 213 into a glue curing device (not shown), such as an oven, to cure the potting glue L in the accommodation trough 213.

Figure 10B:
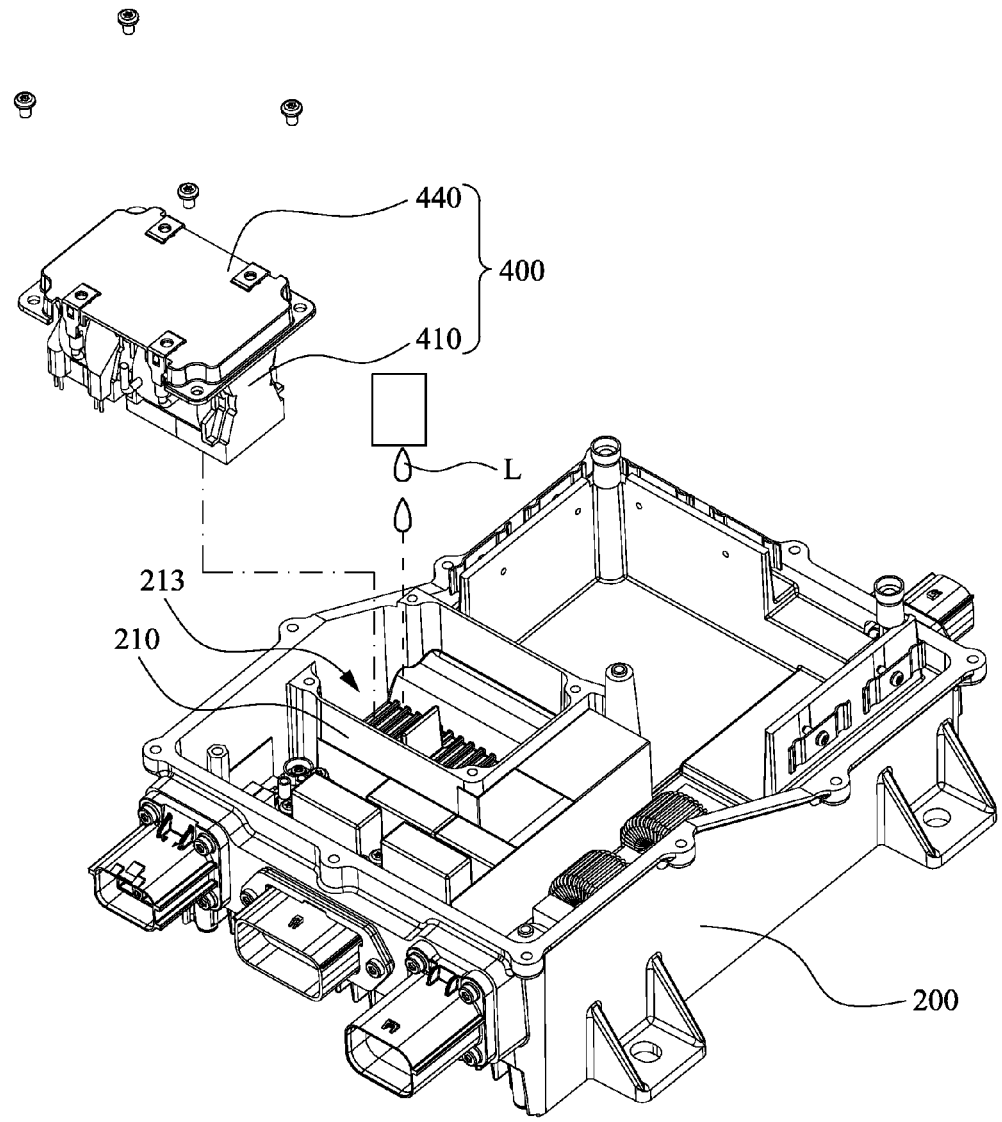
FIG. 10B is a perspective view illustrating that the potting glue is filled into an accommodation trough without the electromagnetic inductive module.

In other embodiments, step 902 further includes the following detailed operations. FIG. 10B is a perspective view illustrating that the potting glue L is filled into the accommodation trough 213 without objects. As shown in FIG. 10B, the potting glue is filled into the accommodation trough 213, and the potting glue can be partially filled into the accommodation trough 213. Then, as shown in FIG. 6A, the magnetic components 410 of the electromagnetic inductive module 400 is disposed in the accommodation trough 213, such that the magnetic components 410 is infiltrated into the potting glue L (the situation is similar to the situation that the magnetic components 410 is disposed in the potting glue body 215 in FIG. 6B).

As shown in FIG. 6A, specifically, when the electromagnetic inductive module 400 is disposed in the accommodation trough 213, i.e., the magnetic components 410 is infiltrated into the potting glue (refer to the potting glue body 215) in the accommodation trough 213, the cover 440 is covered on and fixed to the three-dimensional structure 210 after the magnetic component 410 is disposed in the accommodation trough 213. At this time, the potting glue (refer to the potting glue body 215) is located between the gap G between the magnetic components 410 and the three-dimensional structure 210. The detailed operations of step 902 may be applied to the situation that the size of the opening of the accommodation trough 213 is smaller in an assembling environment with better visibility. Embodiments of this disclosure are not limited thereto.

After the electromagnetic inductive module 400 is infiltrated into the potting glue L (refer to the potting glue body 215), the operations further includes placing the accommodation trough 213 into a glue curing device (not shown in FIGS.), such as an oven, to cure the potting glue L in the accommodation trough 213.

In step 902, the three-dimensional structure 210 may be the independent three-dimensional structure 220 detachably disposed on the heat-dissipating base or the integrated three-dimensional structure 210 is a portion of the heat-dissipating base 200.

For example, when the three-dimensional structure is the independent three-dimensional structure 220 (see FIG. 7B) and the potting glue is already filled in the independent three-dimensional structure 220, the potting glue in the independent three-dimensional structure 220 can be cured independently, and then the independent three-dimensional structure 220 is assembled on the heat-dissipating base 200. On the contrary, when the three-dimensional structure is the integrated three-dimensional structure 210 (see FIG. 2B), the entire heat-dissipating base 200 including the integrated three-dimensional structure 210 is required to be placed into the glue curing device to cure the potting glue.

Before assembled on the heat-dissipating base 200, the independent three-dimensional structure 220 can be placed into the glue curing device in advance. Therefore, because a weight of the heat-dissipating base 200 is greater than a weight of the independent three-dimensional structure 220, it takes less effort and time for workers to move the independent three-dimensional structure 220. In addition, a volume of the heat-dissipating base 200 of the FIG. 2B is greater than a volume of the independent three-dimensional structure 220, the glue curing device can accommodate more the independent three-dimensional structure 220 of FIG. 7B than the heat-dissipating base 200 of FIG. 2B while the curing process is performed. Therefore, if the independent three-dimensional structure 200 is adopted and the curing process is performed before the independent three-dimensional structure 200 is assembled to the heat-dissipating base 200 of FIG. 7B, the assembly time and the curing cost can be reduced.

In addition, as shown in FIG. 6A, when the potting glue is filled in the accommodation trough 213, the workers can entirely fill the gap between the three-dimensional structure 210 and the magnetic components 410 with the potting glue (refer to the potting glue body 215). Or, as shown in FIG. 6B, the workers can partially fill the gap between the three-dimensional structure 210 and the magnetic components 410 with the potting glue (refer to the potting glue body 215), and the height H1 of the potting glue (refer to the potting glue body 215) disposed in the accommodation trough 213 is smaller than the height H2 of the electromagnetic inductive module 400. For example, the height H1 of the potting glue (refer to the potting glue body 215) is a half of the height H2 of the electromagnetic inductive module 400.

People having ordinary skill in the art can make proper modification to the potting glue according to their actual needs. The key point is that the potting glue can be filled in the accommodation trough to coat and protect the magnetic components of the electromagnetic inductive module. The potting glue can be, for example, a liquid potting glue or a semi-solid potting glue. Specifically, the liquid potting glue can be UB-5204, LORD SC-309, and the semi-solid potting glue can be Dow Corning DC527.

Figure 11:
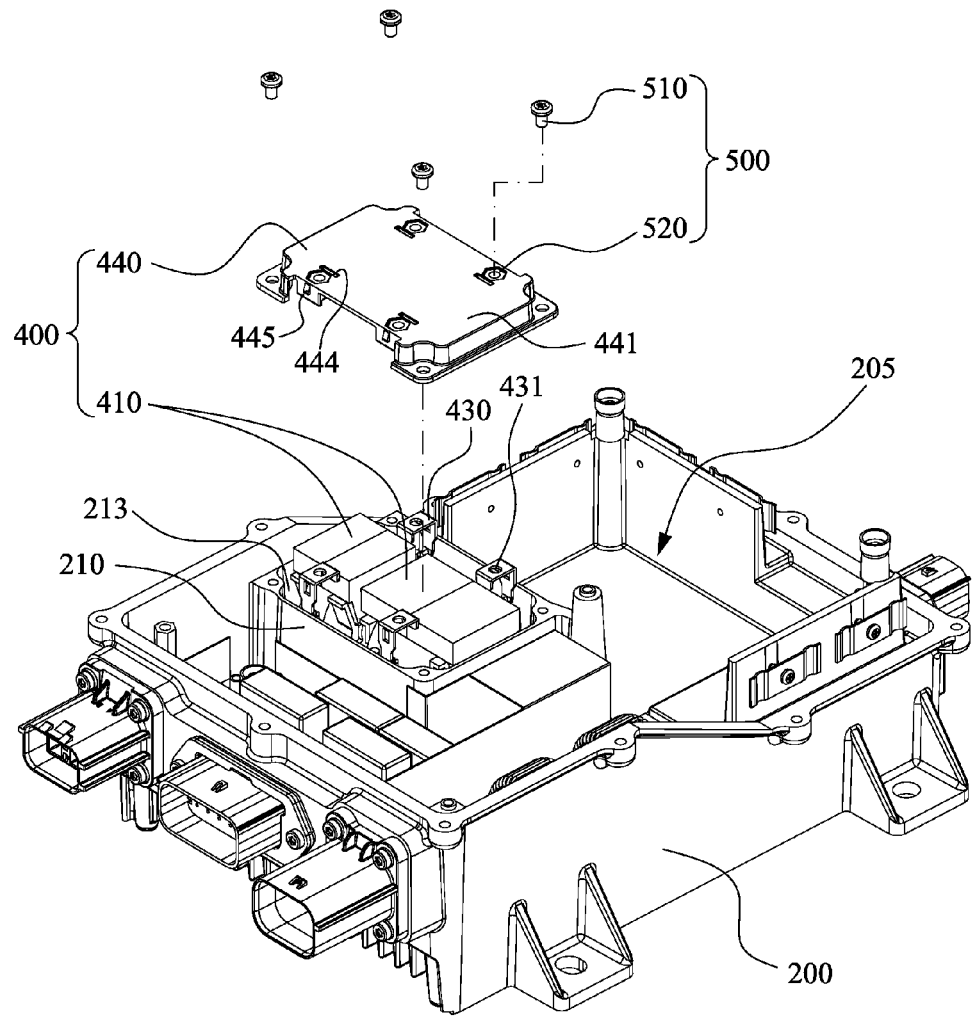
FIG. 11 is a perspective view illustrating that the magnetic component is disposed in the accommodation trough in advance.

In another embodiment, step 901 further includes the following detailed operations. FIG. 11 is a perspective view illustrating that the magnetic component 410 is disposed in the accommodation trough 213 in advance. As shown in FIG. 11, before the cover 440 is covered on the magnetic component 410 of the electromagnetic inductive module 400, the magnetic component 410 is disposed in the accommodation trough independently. Then, the cover 440 is covered on the magnetic component 410. Then the second connecting portion 430 is aligned to the second fixing member 520 of the cover 440 (as shown in FIG. 2B and FIG. 2D).

In another embodiment, step 902 further includes the following detailed operations. As shown in FIG. 2B, after the cover 440 is covered on the magnetic component 410, the cover 440 is fixed to the three-dimensional structure 210. Embodiments of this disclosure are not limited thereto. In other embodiments, the step of aligning the second connecting portion 430 of the magnetic component 410 to the second fixing member 520 of the cover 440 can be performed after the cover 440 is fixed to the three-dimensional structure 210. The filling sequence and details about the potting glue can be similar to the aforementioned embodiments.

Step 903 further includes the following detailed operations. As shown in FIG. 2A and FIG. 2C, the second connecting portion 430 of the electromagnetic inductive module 400 is fixed to the first connecting portion 310 through an electrically conductive fixing member 510. Therefore, the printed wiring board 300 is physically connected to the electromagnetic inductive module 400, and the printed wiring board 300 is electrically connected to the electromagnetic inductive module 400. Specifically, before the second connecting portion 430 is fixed to the first connecting portion 310 by the electrically conductive first fixing member 510, such as a metal screw, the printed wiring board 300 is upside down covered on the electromagnetic inductive module 400, such that the connecting portions 431 of the electromagnetic inductive module 400 respectively face the connecting portion 310 of the printed wiring board 300.

Though the connecting portion of the electromagnetic inductive module of the aforementioned embodiments is fixed to the connecting portion of the printed wiring board by locking, in other embodiments, step 903 further includes the following detailed operations. The connecting portion of the electromagnetic inductive module is electrically connected to the connecting portion of the printed wiring board. For example, through solder welding process, the connecting portion of the electromagnetic inductive module is coupled with the connecting portion of the printed wiring board through conductive pads. Therefore, the printed wiring board is physically connected to the electromagnetic inductive module, and the printed wiring board is electrically connected to the electromagnetic inductive module.

In addition, in step 903, people having ordinary skill in the art can use a coupling method combined with locking and welding according to their actual needs. Embodiments of this disclosure are not limited thereto.

Though all the aforementioned embodiments describes that fixing the electromagnetic inductive module to the printed wiring board to strengthen the stability of the connection of the electromagnetic inductive module and the printed wiring board, embodiments of this disclosure are not limited thereto. Any electronic components with a large volume or a large weight, such as a transistor, a capacitor, a transformer, a choke, etc., can replace the electromagnetic inductive module of all the aforementioned embodiments. The power conversion device and the method for assembling the power conversion device of all the aforementioned embodiments can be applied to an on board charger modules (OBCM) or the relevant technical aspects of the car. Therefore, though the electronic component in the OBCM is heavy, the configuration of the disclosure can strengthen the connection of the electronic component and the printed wiring board and the connection of the electronic component and the heat-dissipating base, thereby reducing the risk that the heavy and large electronic component falls apart from the printed wiring board and thus damages the electronic connection due to the gravitational force or external forces generated by the moves and the brakes of the car, so as to stable the service performance of the OBCM.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims herein is not intended to invoke the provisions of 35 U.S.C. §112, 6th paragraph.

What is claimed is:

1. A power conversion device, comprising:
   a heat-dissipating base comprising a three-dimensional structure having an accommodation trough, and a potting glue disposed in the accommodation trough;
   a printed wiring board comprising a first connecting portion having a first through hole;
   an electronic component disposed between the printed wiring board and the heat-dissipating base and mounted on the heat-dissipating base, the electronic component comprising a magnetic component at least partially disposed in the accommodation trough, and electrically connected to the printed wiring board, wherein a gap is defined between the magnetic component and the three-dimensional structure, and the potting glue is filled in the gap to at least partially cover the magnetic component;
   a fixing assembly fixing the magnetic component and the printed wiring board, such that the magnetic component and the printed wiring board are electrically connected by the fixing assembly; and
   a cover covering the magnetic component and the accommodation trough and fixed to the printed wiring board by the fixing assembly;
   wherein the magnetic component comprises a second connecting portion disposed between the cover and the first connecting portion, and the second connecting portion has a second through hole, the fixing assembly comprises a first fixing member and a second fixing member corresponding to each other, the second fixing member is disposed on the cover; and the first fixing member passes the first through hole and the second through hole and is fixed to the second fixing member, such that the second connecting portion is electrically connected to the first connecting portion.

2. The power conversion device of claim 1, wherein the three-dimensional structure is a portion of the heat-dissipating base or detachably formed with the heat-dissipating base.

3. The power conversion device of claim 1, wherein the electronic component is an electromagnetic inductive module.

* * * * *